(12) United States Patent
Meyer et al.

(10) Patent No.: US 8,012,807 B2
(45) Date of Patent: Sep. 6, 2011

(54) METHOD FOR PRODUCING CHIP PACKAGES, AND CHIP PACKAGE PRODUCED IN THIS WAY

(75) Inventors: Thorsten Meyer, Regensburg (DE); Harry Hedler, Germering (DE); Markus Brunnbauer, Lappersdorf (DE)

(73) Assignee: Infineon Technologies AG, Neubiberg (DE)

( * ) Notice: Subject to any disclaimer, the term of this patent is extended or adjusted under 35 U.S.C. 154(b) by 684 days.

(21) Appl. No.: 11/776,976

(22) Filed: Jul. 12, 2007

(65) Prior Publication Data

US 2008/0012144 A1  Jan. 17, 2008

(30) Foreign Application Priority Data

Jul. 12, 2006 (DE) .......................... 10 2006 032 251

(51) Int. Cl.
*H01L 21/56* (2006.01)
*H01L 23/48* (2006.01)

(52) U.S. Cl. .................. 438/114; 257/773; 257/E23.01; 257/E21.502; 257/690

(58) Field of Classification Search .................... 257/690
See application file for complete search history.

(56) References Cited

U.S. PATENT DOCUMENTS

| 7,030,494 B2 | 4/2006 | Aoki |  |
|---|---|---|---|
| 2001/0016400 A1 | 8/2001 | Lee |  |
| 2002/0113323 A1* | 8/2002 | Nakanishi et al. | 257/784 |
| 2002/0140108 A1 | 10/2002 | Johnson |  |
| 2002/0180017 A1 | 12/2002 | Song et al. |  |
| 2005/0006760 A1* | 1/2005 | Terui | 257/734 |
| 2006/0220262 A1* | 10/2006 | Meyer et al. | 257/779 |
| 2006/0279000 A1* | 12/2006 | Chang et al. | 257/779 |
| 2007/0145564 A1* | 6/2007 | Honer | 257/690 |
| 2008/0308917 A1* | 12/2008 | Pressel et al. | 257/676 |

FOREIGN PATENT DOCUMENTS

DE  10324615  9/2004

\* cited by examiner

*Primary Examiner* — Jarrett J Stark
*Assistant Examiner* — Lawrence Tynes, Jr.
(74) *Attorney, Agent, or Firm* — Dicke, Billig & Czaja, PLLC (57) ABSTRACT

A method for producing chip packages is disclosed. In one embodiment, a plurality of chips is provided. The chips each have first pads. Second connection pads are applied on the wafer, wherein each second pad is electrically connected to a first pad.

21 Claims, 7 Drawing Sheets

METHOD FOR PRODUCING CHIP PACKAGES, AND CHIP PACKAGE PRODUCED IN THIS WAY

CROSS-REFERENCE TO RELATED APPLICATIONS

This Utility Patent Application claims priority to German Patent Application No. DE 10 2006 032 251.7 filed on Jul. 12, 2006, which is incorporated herein by reference.

BACKGROUND

The invention relates to a method for producing chip packages, and to a chip package produced in this way.

In a conventional packaging process for semiconductor chips, the chips are packaged separately after the sawing of the semiconductor wafer. By contrast, in wafer level packaging, the semiconductor chips of a wafer are packaged at the wafer level. For this purpose, by using a thin-film technology, pads of the chips are rewired in one or a plurality of overlying metallization layers and contacts are applied in the form of solder balls for contact-connecting the finished wafer level package to the printed circuit board. In this case, the basic area of the wafer level packages corresponds, in principle, to the chip area of the semiconductor chips.

By comparison with conventional wafer level packages, fan-out wafer level packages have a basic area that is greater than the chip area, with the result that a larger basic area is available for contact-connecting the finished packages to the printed circuit board.

Packages of this type are often produced in such a way that firstly a semiconductor wafer is sawn. After the sawing individual chips are arranged alongside one another on a carrier device with a larger distance between them in comparison with the distance on the wafer. This is typically done by using an automatic pick-and-place machine that takes the individual chips from the sawn wafer assembly and positions them onto a carrier device. The chips are subsequently encapsulated into e.g., mould compound, thereby giving rise to a reconstituted wafer composed of mould compound with embedded semiconductor chips. Using a thin-film technology applied to the cured reconstituted wafer, the pads of the chips are rewired in overlying layers and solder balls for contact-connecting the finished wafer lever package to the printed circuit board are applied. For this purpose, the wafer has to be exposed by using a mask aliner or a stepper. Since the positioning and orientation of the chips on the carrier device can only be effected with a limited accuracy and additional inaccuracies with regard to the positioning and orientation of the chips also occur in the subsequent processes, the linking of, in particular, small and/or closely spaced-apart pads in the context of the rewiring is critical. Thus, short circuits between two pads or non-linking of individual pads can occur as a result of an incorrect positioning and/or rotation during the rewiring. This regularly leads to the failure of the affected component. Defects of this type are to be expected to an increasing degree in the future since the pad size and the pad pitch (distance between the mid points of two adjacent pads) will decrease further while the wafer or panel sizes (panel size=number of chips packaged simultaneously in a method sequence) in the context of packaging will, however, increase further.

For these and other reasons, there is a need for the present invention.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise. Elements provided with identical reference symbols in the various figures correspond to one another.

The present invention provides a chip package and a method for producing chip packages which eliminates disadvantages mentioned above.

In the method according to one embodiment for producing chip packages, a semiconductor wafer including a plurality of semiconductor chips is provided. The semiconductor chips each have first connection pads. Moreover, second connection pads are applied on the semiconductor wafer, wherein second connection pads are electrically connected to first connection pads. The semiconductor wafer is separated into individual semiconductor chips, for example by sawing. A further process involves producing a reconstituted wafer from mould compound in which a plurality of semiconductor chips are encapsulated. In addition, the second connection pads are contact-connected. Furthermore, the reconstituted wafer is separated into individual chip packages.

In one embodiment, the chip package includes a semiconductor chip accommodated in a mould compound. The semiconductor chip has first connection pads which are electrically connected to second connection pads on a dielectric layer above the semiconductor chip, wherein the electrical connections between the first connection pads and the second connection pads are realized in the wafer assemblage (that is to say before the wafer is separated into individual chips).

In one embodiment, an intermediate product during the production of chip packages is a semiconductor wafer including a plurality of semiconductor chips, wherein each semiconductor chip has first connection pads which are electrically connected to second connection pads on a dielectric layer above the semiconductor chip.

Figure 1:
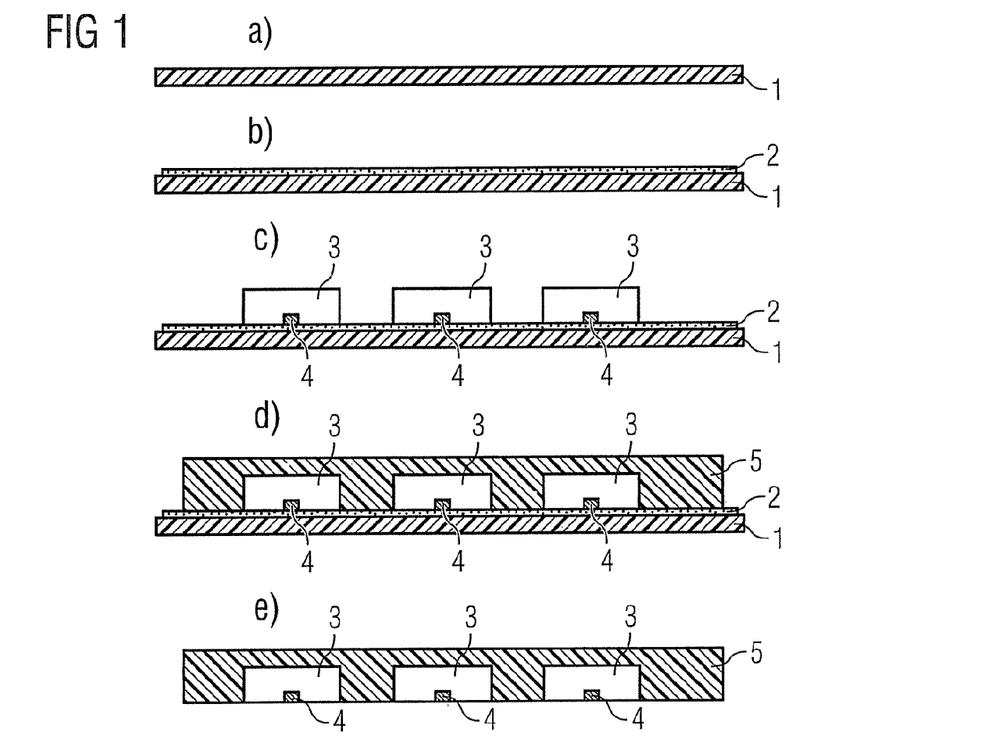
FIG. 1 illustrates the process sequence during embedding of chips into mould compound.

FIG. 1 illustrates in the manner of an overview the process sequence during the embedding of chips into mould compound. In method process a), a carrier material 1 (for example metal, silicon or a polymer) is provided. In process b) the carrier material 1 is coated with an adhesive layer realized e.g., as adhesive film 2. The adhesive film 2 is double-sided adhesive, the adhesive connection being detachable by supplying energy (e.g., heating). In process c) (also referred to as pick & place), the carrier device including the carrier material 1 and the adhesive film 2 is populated with semiconductor chips 3 that have been tested at the wafer level and subsequently sawn from a wafer assembly. In this case, the semiconductor chips 3 are brought by their active top side, at which the chip pads 4 are arranged, onto the top side of the adhesive film 2. In process d) (also referred to as overmoulding), the carrier device including the semiconductor chips 3 is overmoulded with a mould compound 5. After the curing of the reconstituted wafer formed in this way, the carrier device is removed from the reconstituted wafer in process e). Afterwards, by using a thin-film technology applied to the reconstituted wafer, the pads of the chips are rewired in overlying layers and solder balls are applied (not illustrated). Finally, the reconstituted wafer is sawn into individual chip packages (not illustrated).

Figure 2:
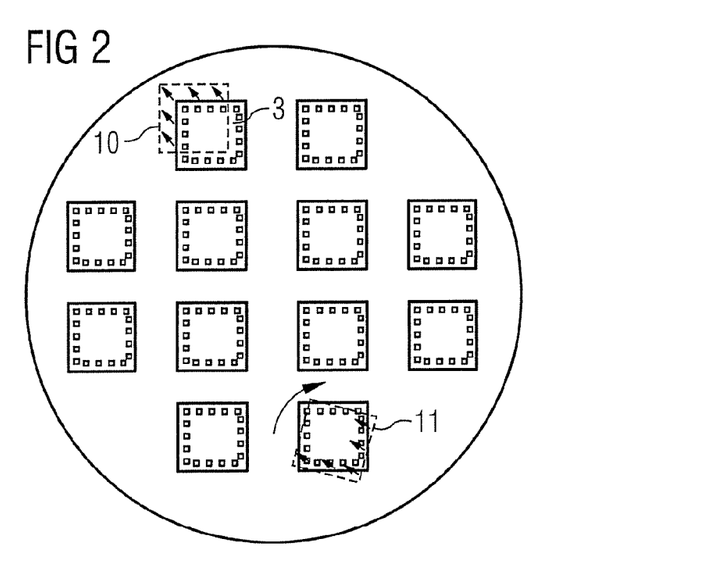
FIG. 2 illustrates the arrangement of a plurality of semiconductor chips on the reconstituted wafer.

FIG. 2 illustrates the arrangement of a plurality of chips 3 on the reconstituted wafer. In contrast to FIG. 1, in FIG. 2 by way of example the chip pads 4 are arranged in rectangular fashion at the edge of the chip area (in the pad frame), while in FIG. 1 the chip pads 4 are arranged on a line longitudinally centrally over the chip. Furthermore, FIG. 2 indicates an erroneous position 10 and a rotated arrangement 11 of a semiconductor chip 3 in dashed illustration. Such incorrect positioning and/or rotations of the semiconductor chips 3 on the reconstituted wafer can be brought about by a large number of causes: first, the populator in the course of populating the carrier device operates only with a limited accuracy, such that an offset and/or a rotation of the semiconductor chips can result. Moreover, it is possible for the semiconductor chips 3 to be displaced during coating with the mould compound 5. Furthermore, the non-uniform volume shrinkage of the mould compound 5 is to be expected during the curing of the mould compound 5. Different coefficients of thermal expansion are furthermore possible.

Figure 3:
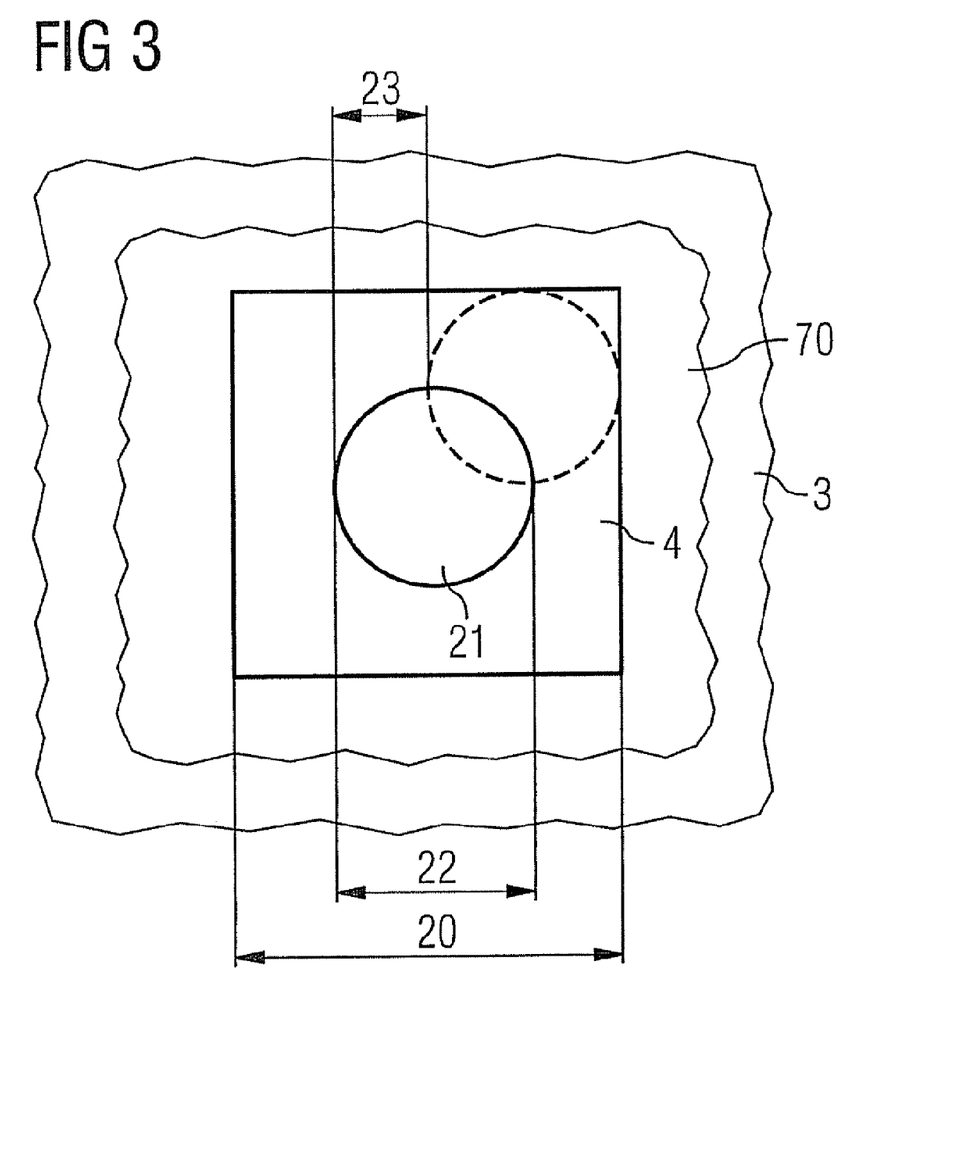
FIG. 3 illustrates a maximum permissible incorrect positioning during the contact-connection of a chip pad.

FIG. 3 illustrates the maximum permissible incorrect positioning during the contact-connection of a chip pad 4 (for example composed of aluminium or copper), the figure not being true to scale. The square chip pad 4 has an edge length 20 of 64 µm. The chip surface is coated with a layer of dielectric 70, for example with a layer of polyimide. For contact-connecting each chip pad 4, the respective opening 21 is provided in the layer of dielectric 70 above the respective chip pad 4, the opening being smaller than the chip pad 4. The—here circular—opening has a diameter 22 of 20 µm in the present case and should be situated as centrally as possible above the chip pad 4. In the course of an incorrect positioning and rotation of the chips on the reconstituted wafer, a maximum displacement 23 in the x or y direction of 22 µm can be afforded tolerance without the opening 21 projecting beyond the area of the chip pad 4.

A specific proportion of the incorrect positioning can be compensated for by design adaptation of rewiring and dielectric. As the dimensions of the pads and the pad pitch decrease, however, this compensation can no longer take place, and so the risk of a short circuit between two pads by the metallization increases.

Figure 4:
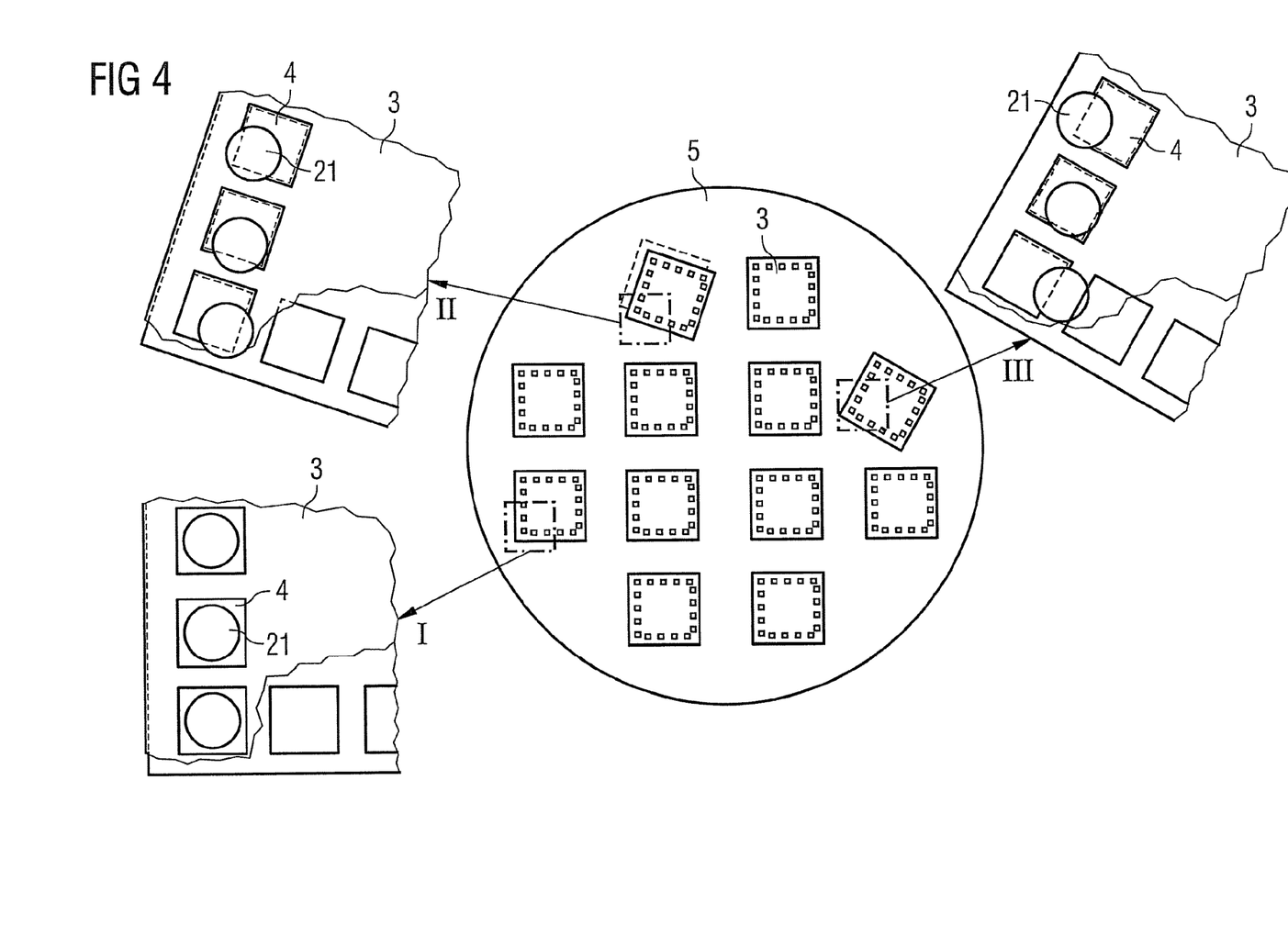
FIG. 4 illustrates the influence of the incorrect positioning of the chips on the contact-connection of the chip pads.

FIG. 4 illustrates the influence of the incorrect positioning of the chips 3 on the contact-connection of the chip pads 4. In this case, I, II and III represent three enlarged excerpts relating to the contact-connection of chip pads 4.

Excerpt I illustrates the contact-connection of a correctly positioned chip 3. The opening 21 in the dielectric is in each case arranged centrally above the pad 4. There is neither the risk of a short circuit between two pads 4 nor the risk of the pad 4 not being contact-connected.

Excerpt II illustrates the contact-connection of a chip 3 with slight incorrect positioning. Here the risk of a short circuit and of contact-connection not being effected can still just be avoided by adapting the position of the openings 21.

Excerpt III illustrates the contact-connection of a chip 3 with severe incorrect positioning. Here there is the risk of a short circuit between two pads 4 (as illustrated) and of a pad 4 not being contact-connected (not illustrated). The same holds true even for a smaller incorrect positioning than that illustrated in excerpt III if the pad size and/or the pad pitch are correspondingly smaller.

By way of example, a pitch of 50 µm and 40 µm and a diameter of the opening 21 of 43 µm and 36 µm are envisaged for future 65 nm and 45 nm semiconductor technologies, respectively. At the present time, an overall incorrect positioning amounting to ±15 µm can be assumed in the context of placement and the additional displacement to be expected in the subsequent processes. If such an overall incorrect positioning is taken as a basis, rejects of up to 100% are to be expected in the contact-connection of the chip pads 4 in the case of the future 65 nm and 45 nm semiconductor technologies mentioned above.

In one or more embodiments, second pads are applied to the chips of the wafer before the wafer is actually singulated wherein each second pad is electrically connected to a chip pad.

Figure 5:
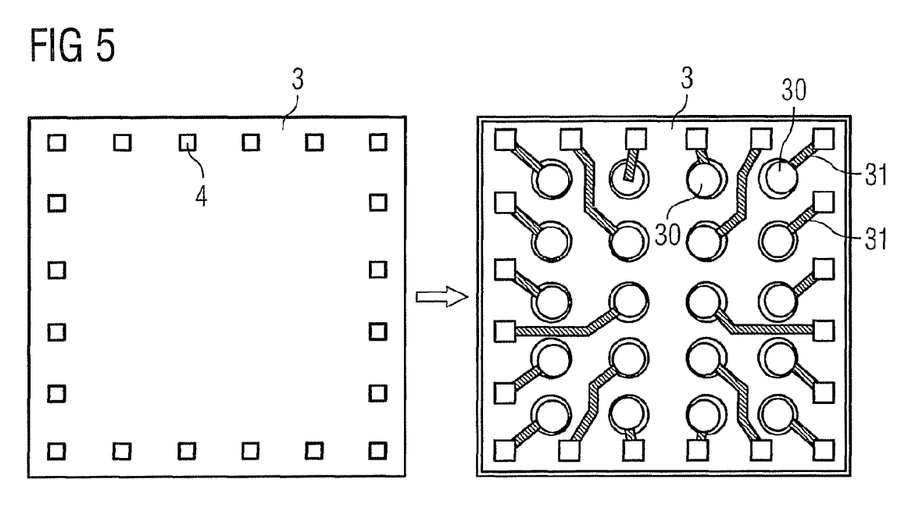
FIG. 5 illustrates the rewiring of the chip pads to second pads.

FIG. 5 illustrates a chip 3 as part of a wafer on the left-hand side, the chip having chip pads 4. Preferably, the pad geometry is enlarged and extended by using a thin-film technology actually prior to the singulation of the wafer and the subsequent production of the reconstituted wafer. For this purpose—as illustrated on the right of FIG. 5—second pads 30 are formed in the context of a rewiring (plus a layer of dielectric), the second pads being connected to the chip pads 4 by using metal lines 31. In this case, the second pads 30 have a larger area than the chip pads 4 and also a larger pitch. This can be realized in particular by the second connection pads 30—as illustrated on the right in FIG. 5—being applied essentially over the whole area over the chip area, instead of only being arranged in a partial region, e.g., pad frame.

Figure 6:
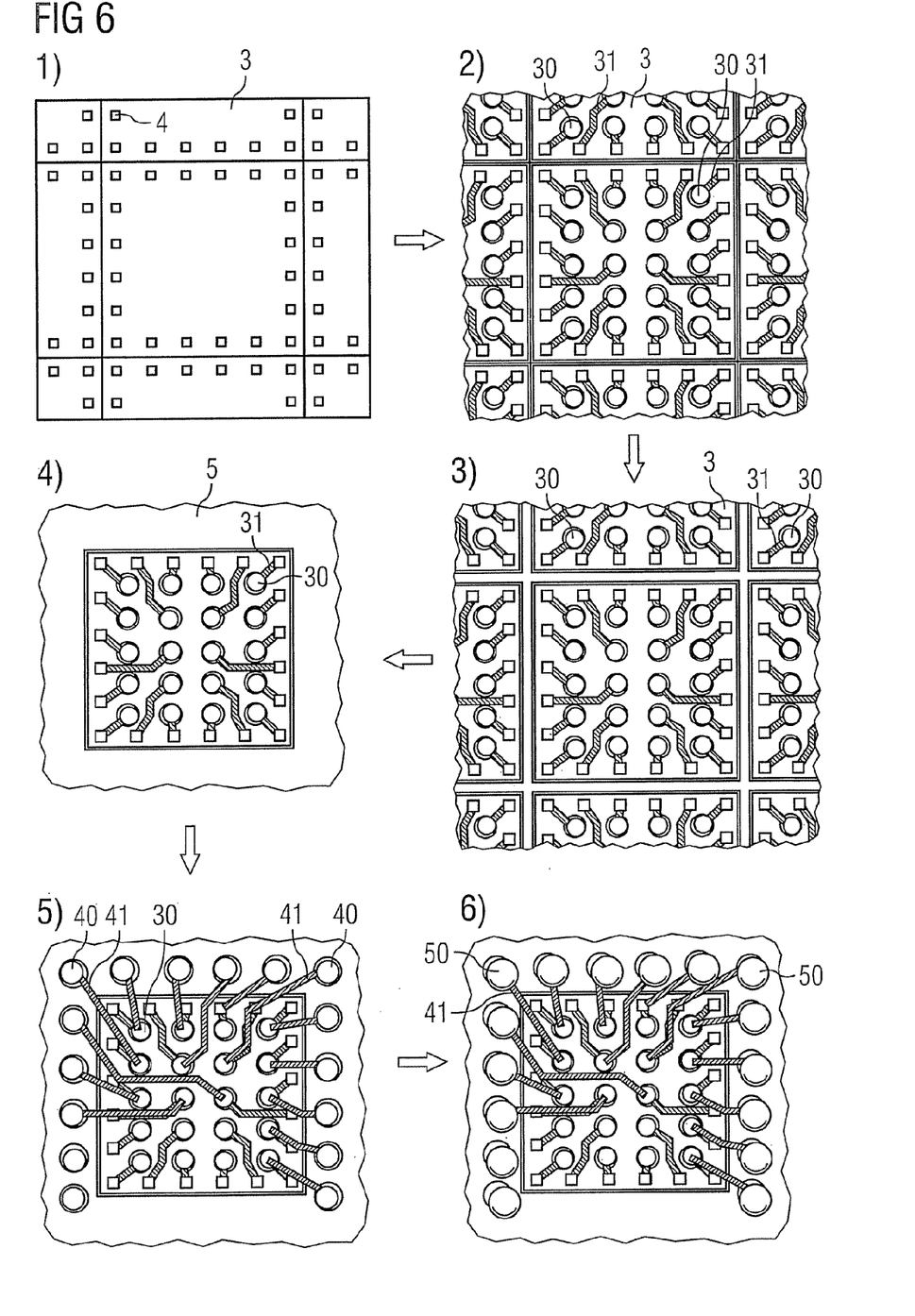
FIG. 6 illustrates an exemplary embodiment of a method according to the invention for producing chip packages.

FIG. 6 illustrates an exemplary embodiment of the method according to the invention for producing chip packages.

The first method process (see 1 in FIG. 6) involves providing a semiconductor wafer including a plurality of semiconductor chips 3. The semiconductor chip 3 each have chip pads 4 (typically composed of aluminium or copper). In this case, the wafer has undergone all the processes of a front end process. Front end process denotes those processes which the wafer undergoes as a whole, i.e. lithography, diffusion, ion implantation and the application of the chip wiring levels and of the chip insulator layers.

In the second process (see 2 in FIG. 6), the chip pads 4 are rewired—as described above in connection with FIG. 5. For this purpose, second pads 30 are applied on the semiconductor wafer by using thin-film processing, wherein each second pad 30 is connected to a chip pad 4 by using a metal line 31. For this, firstly a layer of dielectric is applied on the wafer (not illustrated). The second pads 30 and the metal lines 31 are then formed by application of a common metallization layer, the redistribution layer (RDL).

In the third process (see 3 in FIG. 6), the semiconductor wafer is sawn, with the result that the semiconductor chips 3 are singulated.

Afterwards, in the fourth process (see 4 in FIG. 6), a carrier device—as illustrated in FIG. 1—is populated with singulated chips 3. In this case, the number of chips placed need not correspond to the total number of chips 3 of a wafer. Afterwards—as illustrated in FIG. 1—the reconstituted wafer is produced by using mould compound 5, in which the semiconductor chips 3 are embedded in the manner illustrated in FIG. 1.

The second pads 30 are thereupon rewired by using a thin-film processing in the fifth process (see 5 in FIG. 6). For this purpose, a further dielectric layer (the dielectric layer 61 in FIG. 10), and third pads 40 are applied on the reconstituted wafer, wherein each third connection pad 40 is electrically connected to a second connection pad 30 by using a metal line 41. In addition, a layer of soldering resist is applied. In this case, the third pads 40 can be arranged both outside the chip area, in the so called fan-out region, and additionally within the chip area.

In the sixth process, solder balls 50 for contact-connecting the finished chip packages to the printed circuit board are applied on the third pads 40. The reconstituted wafer is subsequently sawn, with the result that the individual chip packages are singulated (not illustrated).

Figure 7:
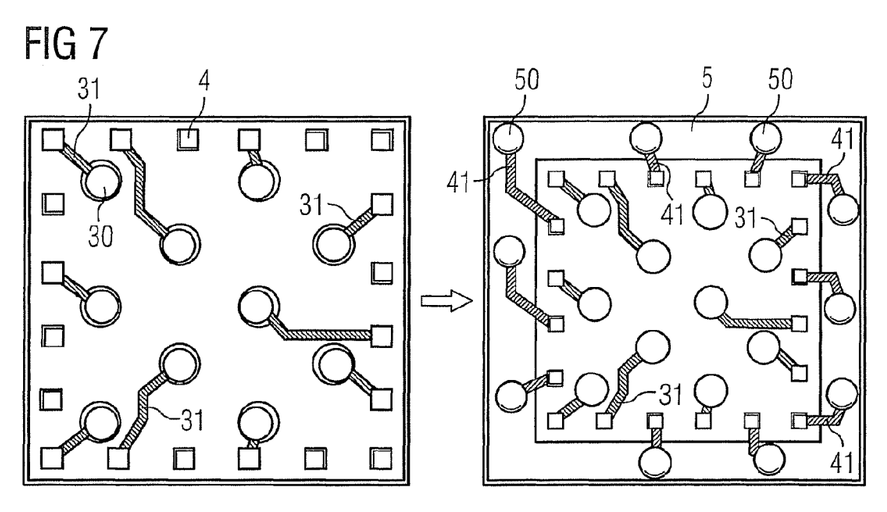
FIG. 7 illustrates an alternative exemplary embodiment relating to the contact-connection of the chip pads.

FIG. 7 illustrates an alternative exemplary embodiment relating to the contact-connection of the chip pads. In the case of the chip package illustrated on the left in FIG. 7, the solder balls 50 are arranged both in the fan-out region, i.e. outside the chip area, and within the chip area. Moreover, in the context of the method in one embodiment, it is not mandatory for each chip pad 4 to be rewired in each case to a second pad 30 prior to the separation of the wafer, the second pad 30 being rewired in each case to a third pad 40 after the separation of the wafer. Individual chip pads 4 can also be connected to a solder ball 50 after the separation of the wafer (by using a third pad 40 and optionally a metal line 41) without the rewiring carried out before the separation of the wafer. In addition, not all of the second pads 40 necessarily have to be rewired prior to contact-connection with a solder ball 50.

Figure 8:
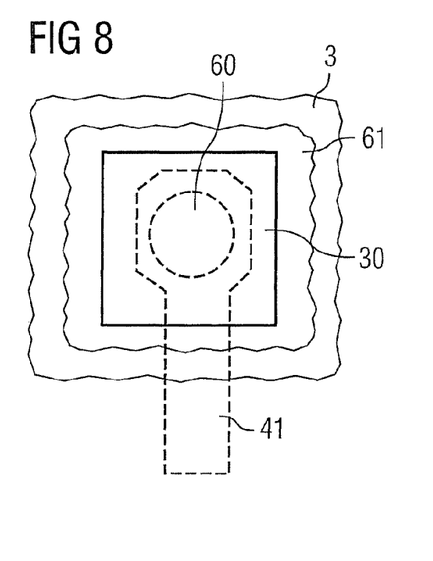
FIG. 8 illustrates a first embodiment of the contact-connection of a second pad.

FIG. 8 illustrates a first embodiment of the contact-connection of a second pad 30. A layer of dielectric 61 is applied above the second pad 30. Arranged in the layer of dielectric 61, directly above the second pad 30, is a via 60, i.e. an opening in the layer of dielectric 61 which is filled with a conductive material (for example the metal of the patterned metallization layer situated above the second pad 30). Furthermore, a metal line 41 as part of the patterned metallization layer is provided for contact-connecting the second pad 30. In the embodiment illustrated in FIG. 8, the area of the second pad 30 extends both beyond the area of the via 60 and beyond the area of the metal line 41 in the contact region with the via 60. In this case, the area of the metal line 41 in the contact region extends beyond the area of the via 60. The via 60 is therefore smaller than the second pad 30 and the metal line 41 is narrower than the second pad 30 in the contact region. In the embodiment illustrated in FIG. 8, the width of the via 30 amounts to up to 70% of the width of the second connection pad 30.

Figure 9:
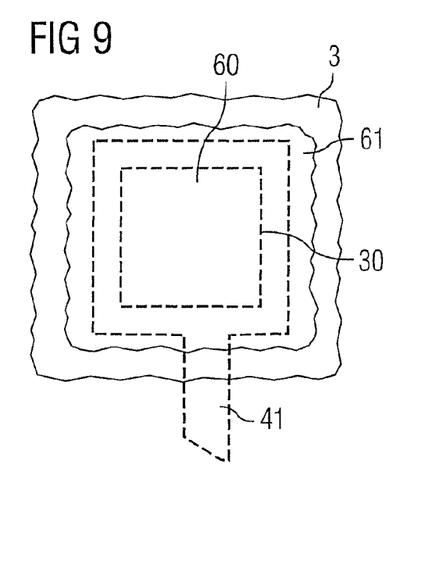
FIG. 9 illustrates a second embodiment of the contact-connection of a second pad.

FIG. 9 illustrates a second, alternative embodiment of the contact-connection of a second pad 30. In this embodiment, the area of the metal line 41 in the contact region with the via 60 extends beyond the area of the second pad 30, i.e. the metal line 41 is wider than the second pad 30 in the contact region. Furthermore, in this case, the area of the via 60 should preferably be—as illustrated in FIG. 9—essentially congruent with the area of the second pad 30, i.e. the via 60 is approximately as large as the second pad 30 in this case. In the embodiment illustrated in FIG. 9, the width of the metal line 41 in the contact region is preferably 130 to 200% of the width of the second pad 30.

An incorrect positioning can be compensated for by using both embodiments in FIGS. 8 and 9.

Figure 10:
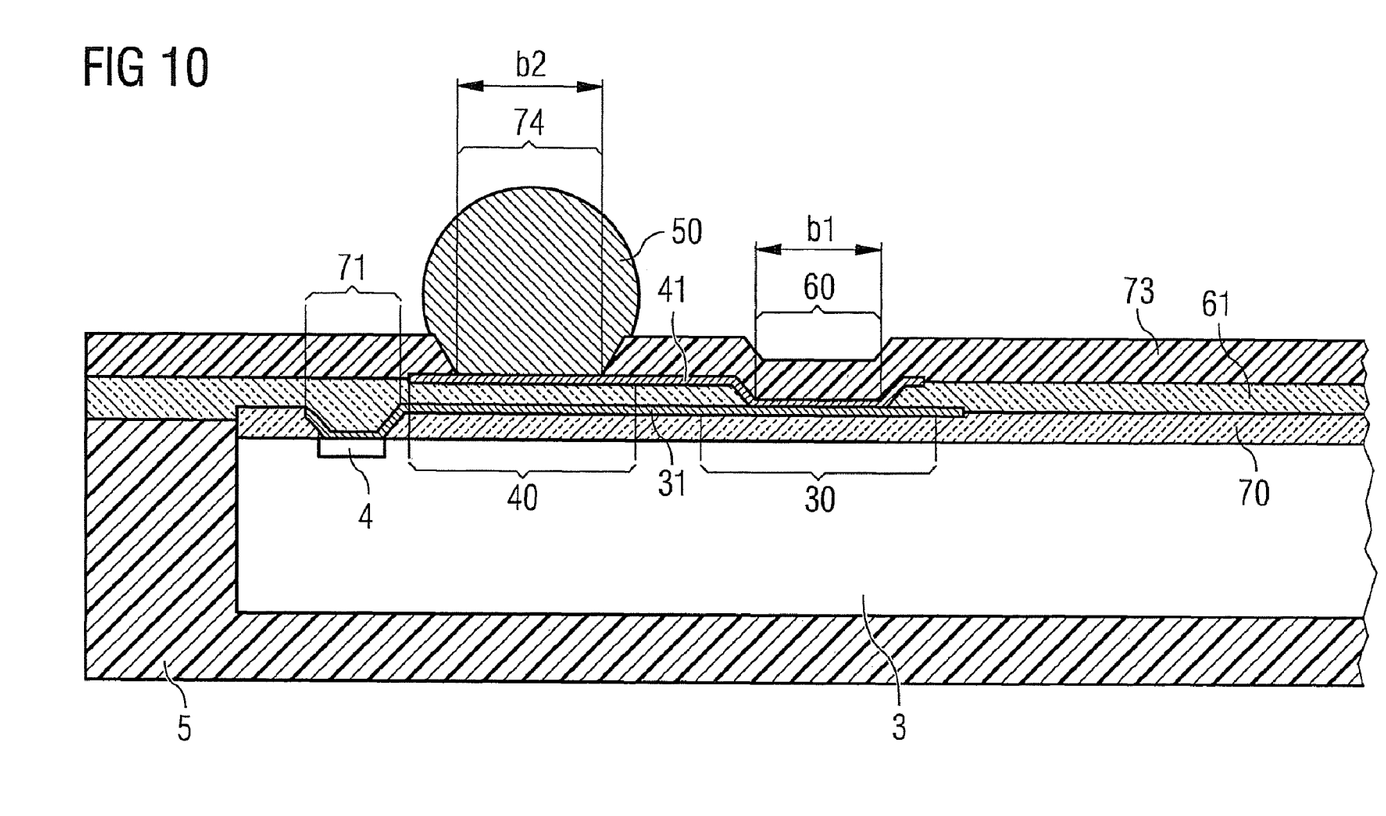
FIG. 10 illustrates an exemplary arrangement of the layers of a chip package produced.

FIG. 10 illustrates an exemplary arrangement of the layers of a chip package produced according to one embodiment of the method. The semiconductor chip 3 having a typical chip thickness of 50 to 500 μm is in this case embedded into a mould compound 5 at its lateral surfaces and often also at its non-active rear side. In this case, the thickness of the layer of mould compound 5 is approximately 0 to 500 μm. A first layer of dielectric 70 (layer thickness approximately 5 μm) is applied on the active top side of the chip 3, the chip pads 4 being situated at the active top side. Vias 71 are configured in the first layer of dielectric 70 directly above the chip pads 4. A metal line 31 as part of a first patterned metallization layer (layer thickness approximately 6 μm) is provided for contact-connecting each chip pad 4 by using a via 71. Furthermore, second pads 30 are shaped in the first patterned metallization layer, the second pads, for compensating for an incorrect positioning of the chip 3 in the reconstituted wafer, preferably—as can be seen in FIG. 10, being configured such that they are significantly larger than the chip pads 4. For fault-free contact-connection, the via openings 60 should have a width or a diameter B1 of 60 to 150 μm. A second layer of dielectric 61 (layer thickness approximately 5 μm) is situated above the first patterned metallization layer. Vias 60 are configured in the second layer of dielectric 61 directly above the second pads 30. A metal line 41 as part of the second patterned metallization layer (layer thickness approximately 6 μm) is provided for contact-connecting each second pad 30 by using a via 60. Furthermore, third pads 40 are shaped in the second patterned metallization layer 61. A layer of soldering resist 73 which typically has a thickness of approximately 10 μm, is situated above the second patterned metallization layer. Openings 74 are configured in the layer of soldering resist 73 directly above the third pads 40, the openings in each case receiving a solder ball 50 for contact-connecting the finished chip packages to the printed circuit board. The openings 74 typically have a diameter B2 of 250 μm, the solder balls 50 typically having a diameter of 300 μm in each case.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method for producing chip packages comprising:
providing a semiconductor wafer comprising a plurality of semiconductor chips, the semiconductor chips having first connection pads; and thereafter
applying second connection pads on the semiconductor wafer, including electrically connecting second connection pads to the first connection pads;
separating the semiconductor wafer into individual semiconductor chips;
producing a reconstituted wafer from mold compound in which a plurality of the semiconductor chips are encapsulated;
applying third connection pads to the reconstituted wafer; and
electrically connecting at least some of the third connection pads to the second connection pads using a thin-film process technology.

2. The method of claim 1, comprising:
separating the reconstituted wafer into individual chip packages.

3. The method of claim 1, comprising:
populating a carrier device, which carries the later reconstituted wafer, with a plurality of semiconductor chips.

4. The method of claim 3, comprising:
wherein the carrier device comprises an adhesive layer;
a plurality of semiconductor chips are brought by their active top side onto the top side of the adhesive layer; and
after the production of the reconstituted wafer, the adhesive layer is detached from the reconstituted wafer.

5. The method of claim 1, wherein connecting second connection pads to the first connection pads comprises using a thin-film process technology.

6. The method of claim 1, comprising:
forming a layer composed of dielectric above the reconstituted wafer;
forming vias in the layer composed of dielectric, wherein each via is respectively located above a second connection pad; and
applying metal lines which are in each case electrically connected to a second connection pad through one of the vias, wherein the area of the second connection pad in each case extends both beyond the area of the via, and beyond the area of the metal line in the contact region with the via.

7. The method of claim 6, comprising wherein a width of the via in each case amounts to 30 to 70% of a width of the second connection pad.

8. The method of claim 1, comprising:
forming a layer composed of dielectric above the reconstituted wafer;
forming vias in the layer composed of dielectric, wherein each via is respectively located above a second connection pad; and
applying metal lines which are in each case electrically connected to a second connection pad through one of the vias, wherein in each case the area of the metal line in the contact region with the via extends beyond the area of the second connection pad, and the area of the via is essentially congruent with the area of the second connection pad.

9. The method of claim 8, comprising wherein the width of the metal line in the contact region in each case amounts to 130 to 200% of the width of the second connection pad.

10. The method of claim 1, comprising wherein the second connection pads are in each case wider than the first connection pads.

11. The method of claim 1, comprising wherein a pitch of the second connection pads is greater than the pitch of the first connection pads.

12. The method of claim 1, comprising applying for each semiconductor chip the second connection pads substantially over the whole area over the chip area.

13. The method of claim 1, comprising wherein the chip packages are fan-out wafer lever packages.

14. The method of claim 1, wherein all second connection pads are located in an inner chip area which is surrounded by the first connection pads.

15. The method of claim 1, further comprising:
applying solder balls on the third connection pads.

16. A method for producing chip packages comprising:
providing a semiconductor wafer comprising a plurality of semiconductor chips, the semiconductor chips having first connection pads;
applying a first layer of dielectric over the semiconductor wafer;
forming second connection pads on the first dielectric layer and electrically connecting second connection pads to the first connection pads through vias in the first dielectric layer;
separating the semiconductor wafer into individual semiconductor chips;
producing a reconstituted wafer from mold compound in which a plurality of the semiconductor chips are encapsulated;
applying a second layer of dielectric over the reconstituted wafer;
forming third connection pads on the second dielectric layer and electrically connecting at least some of the third connection pads to the second connection pads through vias in the second dielectric layer; and
separating the reconstituted wafer into individual chip packages.

17. The method of claim 16, comprising:
applying solder balls on the third connection pads prior to separating the reconstituted wafer into individual chip packages.

18. The method of claim 16, comprising:
contact-connecting a first subset of the first connection pads to the second connection pads before separating the semiconductor wafer; and
contact-connecting a second subset of first connection pads to third connection pads which have not been connected to second connection pads.

19. The method of claim 16, wherein all second connection pads are located in an inner chip area which is surrounded by the first connection pads.

20. The method of claim 1, further including:
applying a layer of dielectric over the reconstituted wafer; and
applying the third connection pads on the dielectric layer, wherein at least some of the third connection pads are connected to the second connection pads through vias in the dielectric.

21. The method of claim 20, wherein the third connection pads are arranged both outside a chip area and within the chip area.

* * * * *